United States Patent
Rinne et al.

(10) Patent No.: US 9,875,980 B2
(45) Date of Patent: Jan. 23, 2018

(54) COPPER PILLAR SIDEWALL PROTECTION

(71) Applicant: Amkor Technology, Inc., Chandler, AZ (US)

(72) Inventors: Glenn Rinne, Apex, NC (US); Dean Zehnder, Hillsborough, NC (US); Christopher J. Berry, Chandler, AZ (US); Robert Lanzone, Chandler, AZ (US); Ludovico Bancod, Chandler, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 14/286,263

(22) Filed: May 23, 2014

(65) Prior Publication Data

US 2015/0340332 A1    Nov. 26, 2015

(51) Int. Cl.
*H01L 23/00* (2006.01)
*H01L 23/498* (2006.01)
*H01L 21/48* (2006.01)

(52) U.S. Cl.
CPC .......... *H01L 24/13* (2013.01); *H01L 21/4846* (2013.01); *H01L 23/49811* (2013.01); *H01L 24/11* (2013.01); *H01L 24/16* (2013.01); *H01L 23/49894* (2013.01); *H01L 24/81* (2013.01); *H01L 2224/05567* (2013.01); *H01L 2224/10145* (2013.01); *H01L 2224/10175* (2013.01); *H01L 2224/119* (2013.01); *H01L 2224/1146* (2013.01); *H01L 2224/1147* (2013.01); *H01L 2224/1182* (2013.01); *H01L 2224/11474* (2013.01); *H01L 2224/11831* (2013.01); *H01L 2224/11849* (2013.01); *H01L 2224/11903* (2013.01); *H01L 2224/131* (2013.01); *H01L 2224/13017* (2013.01); *H01L 2224/13021* (2013.01);

(Continued)

(58) Field of Classification Search
CPC ............... H01L 24/10–24/13; H01L 23/53238
USPC ......................................................... 257/737
See application file for complete search history.

(56) References Cited

U.S. PATENT DOCUMENTS

2001/0040290 A1* 11/2001 Sakurai et al. ............... 257/737
2004/0102037 A1*  5/2004 Tanida et al. ................. 438/669
(Continued)

FOREIGN PATENT DOCUMENTS

| TW | 201041479 | 11/2010 |
| TW | 201138032 | 11/2011 |

OTHER PUBLICATIONS

Taiwan Office Action dated Mar. 11, 2016 for Taiwan Patent Application No. 104113369.

(Continued)

*Primary Examiner* — Christine Enad
(74) *Attorney, Agent, or Firm* — McAndrews, Held & Malloy, Ltd.

(57) ABSTRACT

Methods for copper pillar protection may include forming a metal post over a contact on a semiconductor die, where the metal post comprises a sidewall. A metal cap may be formed on the metal post and may be wider than the width of the metal post. A solder bump may be formed on the metal cap, and a conformal passivation layer may be formed on at least the sidewall of the metal post. The metal cap may be rounded shaped or rectangular shaped in cross-section. The metal post and the metal cap may comprise copper. The metal cap may comprise a copper layer and a nickel layer. The seed metal layer may comprise one or more of titanium, tungsten, and copper. The conformal passivation layer may comprise a nonwettable polymer. Horizontal portions of the conformal passivation layer may be removed utilizing an anisotropic etch such as a plasma etch.

15 Claims, 19 Drawing Sheets

(52) U.S. Cl.
CPC ......... *H01L 2224/1357* (2013.01); *H01L 2224/1369* (2013.01); *H01L 2224/13082* (2013.01); *H01L 2224/13083* (2013.01); *H01L 2224/13147* (2013.01); *H01L 2224/13155* (2013.01); *H01L 2224/13565* (2013.01); *H01L 2224/16225* (2013.01); *H01L 2224/293* (2013.01); *H01L 2224/2929* (2013.01); *H01L 2224/32238* (2013.01); *H01L 2224/73204* (2013.01); *H01L 2224/81191* (2013.01); *H01L 2224/81203* (2013.01); *H01L 2224/83192* (2013.01); *H01L 2924/15311* (2013.01); *H01L 2924/3651* (2013.01)

(56) References Cited

U.S. PATENT DOCUMENTS

| | | | |
|---|---|---|---|
| 2005/0032349 A1* | 2/2005 | Lee et al. | 438/614 |
| 2009/0233436 A1* | 9/2009 | Kim et al. | 438/614 |
| 2010/0165585 A1 | 7/2010 | Lin et al. | |
| 2011/0001250 A1 | 1/2011 | Lin et al. | |
| 2011/0147055 A1 | 6/2011 | Ma et al. | |
| 2011/0193218 A1 | 8/2011 | Arvin et al. | |
| 2011/0266667 A1* | 11/2011 | Wu et al. | 257/737 |
| 2012/0007231 A1 | 1/2012 | Chang | |
| 2012/0306073 A1* | 12/2012 | Yu | H01L 23/147 257/737 |
| 2014/0264843 A1* | 9/2014 | Lin et al. | 257/737 |

OTHER PUBLICATIONS

Korean Office Action dated Mar. 3, 2016 based on Korean Patent Application No. 10-2015-0070876.

Taiwanese Office Action for Application No. 106115964, dated Sep. 5, 2017. (19 pages).

* cited by examiner

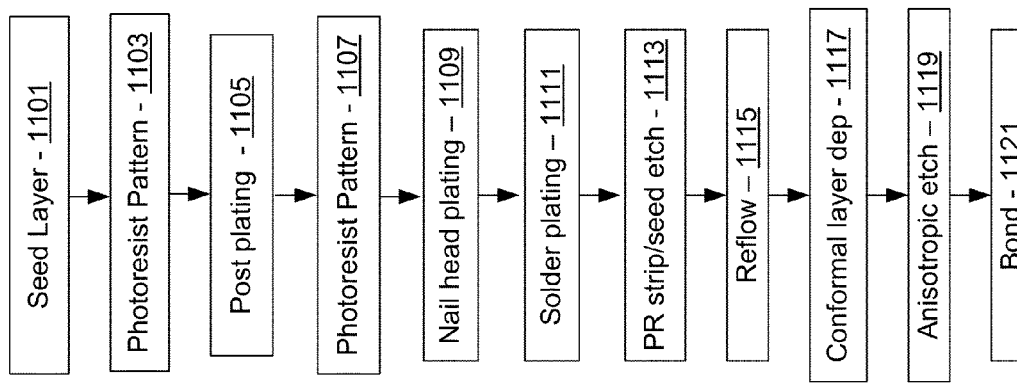

US 9,875,980 B2

COPPER PILLAR SIDEWALL PROTECTION

FIELD

Certain embodiments of the disclosure relate to semiconductor chip packaging. More specifically, certain embodiments of the disclosure relate to a method and system for copper pillar sidewall protection.

BACKGROUND

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present disclosure as set forth in the remainder of the present application with reference to the drawings.

BRIEF DESCRIPTION OF SEVERAL VIEWS OF THE DRAWINGS

FIG. 11 is a flow chart illustrating example steps for a nail-head passivated sidewall pillar connection, in accordance with an example embodiment of the disclosure.

DETAILED DESCRIPTION

Figure 1A:
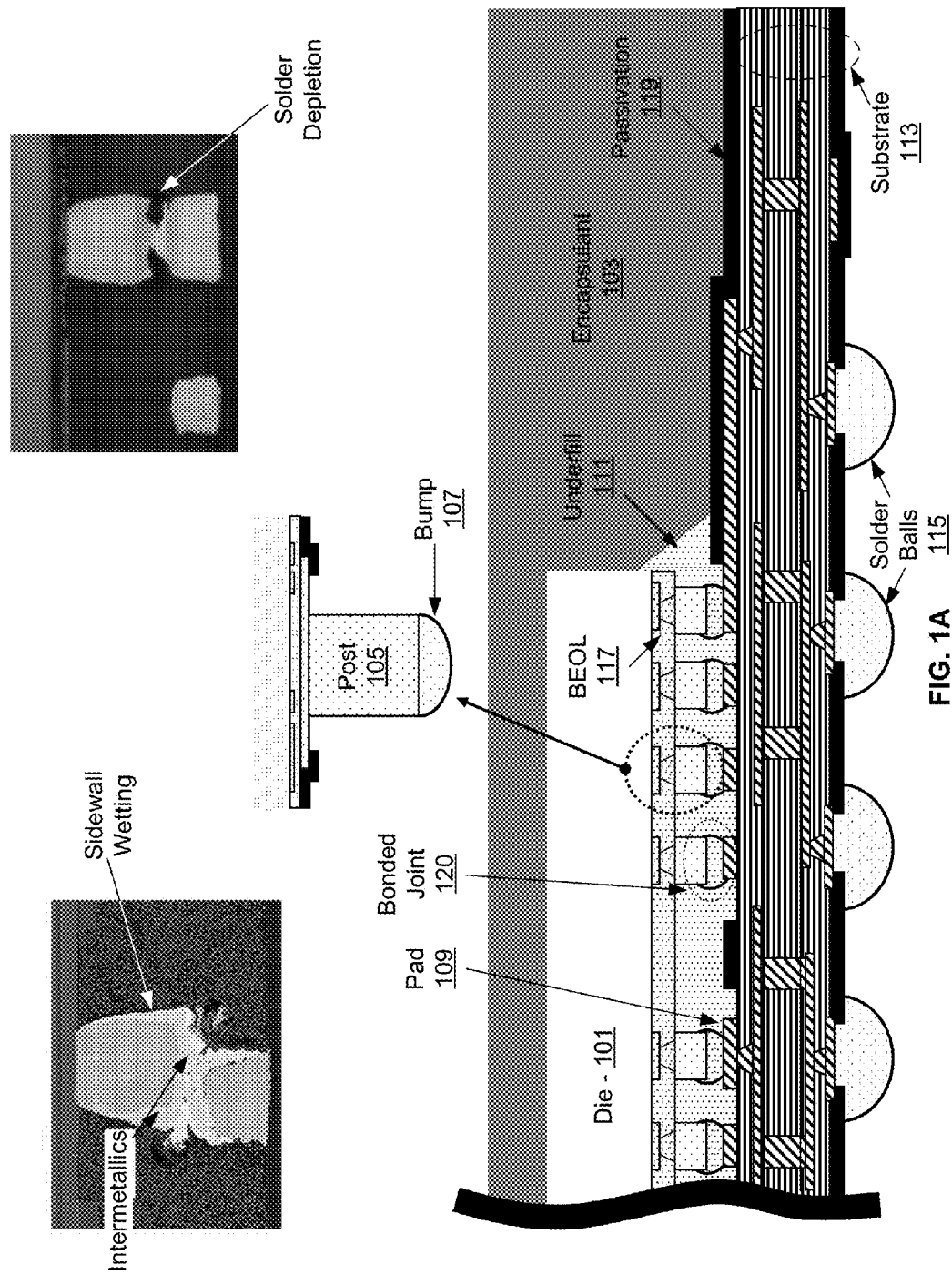
FIG. 1A is a schematic illustrating a molded chip-scale package comprising a flip-chip bonded die, in accordance with an example embodiment of the disclosure.

Certain aspects of the disclosure may be found in copper pillar protection. Example aspects of the disclosure may comprise forming a metal post over a contact on a semiconductor die, where the metal post comprises a sidewall, forming a metal cap on the metal post, where the metal cap is wider than the width of the metal post, forming a solder bump on the metal cap, and forming a conformal passivation layer on at least the sidewall of the metal post. The metal cap may comprise a rounded or rectangular cross-section. The solder bump may be subject to a reflow process. The metal post and the metal cap may comprise copper. The metal cap may comprise a copper layer and a nickel layer. The seed metal layer may comprise one or more of titanium, tungsten, and copper. The conformal passivation layer may comprise a nonwettable polymer. Horizontal portions of the conformal passivation layer may be removed utilizing an anisotropic etch. The anisotropic etch may comprise a plasma etch. A pillar connection with a passivation ring may be formed by forming a photoresist layer on a substrate, forming an opening in the photoresist layer over a portion of a metal contact on the substrate, forming a metal post in the opening on the metal contact. The height of the metal post may be less than the thickness of the photoresist layer. A conformal passivation layer may be formed on the photoresist layer and the metal post. Portions of the conformal passivation layer may be removed so that only a ring of the passivation layer remains at an interface between the photoresist and the metal post. A solder bump may be formed on the metal post and the photoresist may be removed.

Other example aspects of the disclosure may comprise forming a seed metal layer on a metal contact and a passivation layer covering a portion of the contact, forming a photoresist layer on the seed metal layer, forming an opening in the photoresist layer over a portion of the metal contact, and forming a metal post in the opening, where the height of the metal post is closely associated with the thickness of the photoresist layer. A metal cap may be formed on the metal post, where the metal cap may be wider than the width of the post. A solder bump may be formed on the metal cap. The photoresist and an exposed portion of the seed metal layer may be removed, where the exposed portion may comprise the seed metal layer that is not covered by the metal post. A conformal passivation layer may be formed on the passivation layer, the metal post, the solder bump, a portion of the metal cap not covered by the solder bump, and a portion of the metal contact not covered by a remaining portion of the metal seed layer or by the passivation layer. Horizontal portions of the conformal passivation layer may be removed so that only a sidewall of the metal post is covered by the conformal passivation layer. The metal cap may be rounded or rectangular in cross-section. The solder bump may receive a reflow process. The metal post and the metal cap may comprise copper. The metal cap may comprise a copper layer and a nickel layer. The seed metal layer may comprise one or more of titanium, tungsten, and copper. The conformal passivation layer may comprise a nonwettable polymer. The horizontal portions of the conformal passivation layer may be removed utilizing an anisotropic etch, which may comprise a plasma etch.

FIG. 1A is a schematic illustrating a molded chip-scale package comprising a flip-chip bonded die, in accordance with an example embodiment of the disclosure. Referring to FIG. 1A, there is shown a die 101 flip-chip bonded to a substrate 113 using a plurality of bonded joints 120. There is also shown encapsulant material 103, posts 105, solder bumps 107, pads/traces 109, underfill material 111, a substrate 113, solder balls 115, and back end of line (BEOL) layers 117 on the die 101.

The die 101 may comprise an integrated circuit die that has been separated from a semiconductor wafer and may comprise electrical circuitry such as digital signal processors (DSPs), network processors, power management units, audio processors, RF circuitry, wireless baseband system-on-chip (SoC) processors, sensors, and application specific integrated circuits, for example.

The substrate 113 may comprise a multi-layer laminate structure with or without a core and solder balls 115 for electrical connection to an external structure, such as a printed circuit board, for example. The substrate 113 may also comprise a plurality of vias, pads, and electrical traces embedded within and on the substrate 113 for providing electrical connectivity between the top and bottom surfaces, while passivation layers 119 may provide electrical isolation and physical protection for the top and bottom surfaces of the substrate 113.

The bonded joints 120 may comprise the posts 105, solder bumps 107, and the pads/traces 109. The posts 105 may comprise copper posts formed on the die 101 to provide electrical connectivity between devices on the die 101 and external structures via the substrate 113. The posts 105 may be formed on the BEOL layers 117, which may comprise conductive and dielectric layers formed in and on the die 101 that provide electrical connectivity and isolation, respectively, between devices on the die 101 and the posts 105. The solder bumps 107 may comprise a solder material that melts at a lower temperature than the posts 105 and the pads 109. Therefore, when pressed together and heated, the solder bump 107 may form an electrical and physical bond between the posts 105 and the pads 109.

However, an issue with the formation of the bonded joints 120 may occur when the solder material of the bump 107 wets to the sides of the posts 105, as shown in the micrographs above the schematic of FIG. 1. The wetting with the sidewalls may cause a depletion of the solder material causing voids, reducing the reliability of the bonded joints 120. In addition, intermetallic formation may be non-uniform, which may also reduce the reliability of the joint. Tin in the solder bumps 107 may react with copper in the posts 105, thereby narrowing the posts 105.

In an example scenario, the sidewalls of the posts 105 may be protected, such as with a deposited passivation layer or conformal polymer, for example, so that the solder material from the solder bumps 107 does not wet to the sidewalls, resulting in a uniform solder joint between the posts 105 and the pads 109, as shown by the nearly spherical solder joint in the bonded joints 120, and in contrast to the micrographs above the schematic in FIG. 1A.

Figure 1B:
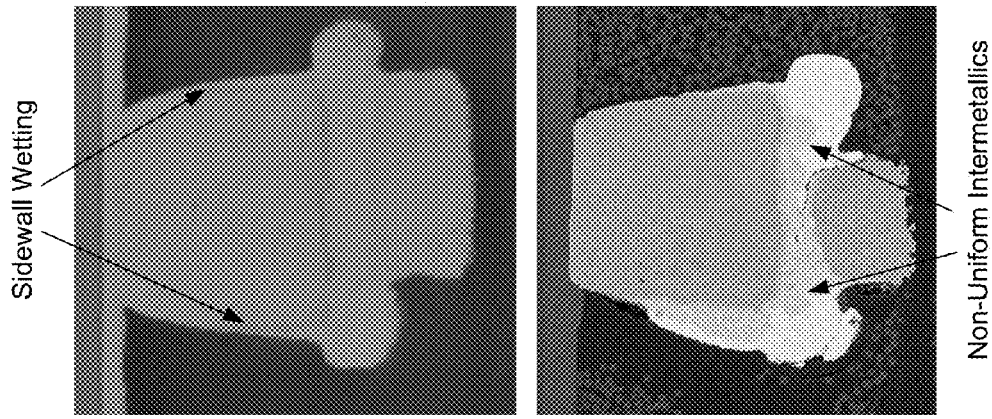
FIGS. 1B and 1C show the formation of a bonded joint, in connection with an example embodiment of the disclosure.
Figure 1C:
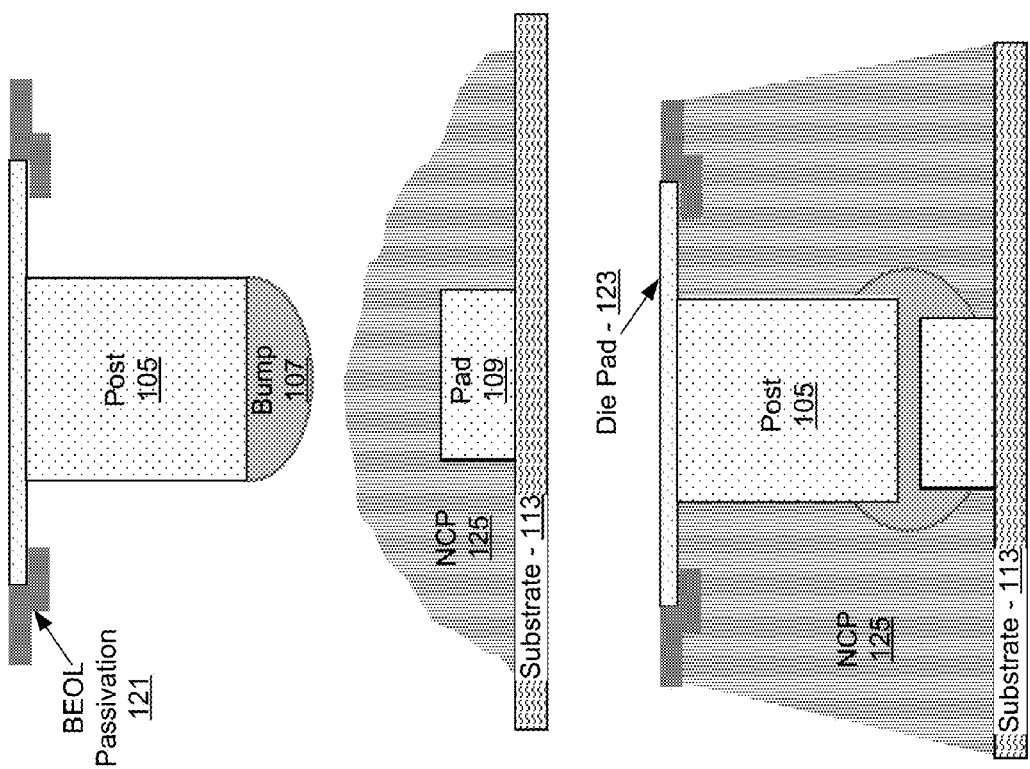

FIGS. 1B and 1C show the formation of a bonded joint, in connection with an example embodiment of the disclosure. Referring to FIG. 1B, there is shown a post 105, a solder bump 107, a pad 109, a substrate 113, BEOL passivation 121, a die pad 123, and non-conductive paste (NCP) 125. The post 105, solder bump 107, and substrate 113, may be substantially similar to these elements as described with respect to FIG. 1A.

The die pad 123 may comprise a conductive pad formed on the die 101 as part of the BEOL 117, which may be electrically isolated from other conductive pads and traces by the BEOL passivation 121, which may comprise an oxide or other dielectric material, for example.

The NCP 125 may comprise a pre-applied underfill material that assists in the forming of the bond and may fill the remaining void between the die and substrate when bonded. However, the NCP 125 may also enhance wetting of the solder in the solder bump 107 to the sidewalls of the post 105 when pressed together and heated, resulting in degraded joints due to non-uniform intermetallics and the formation of voids, for example, as shown in the micrographs to the right in FIGS. 1B and 1C.

Current fine pitch flip chip pillar interconnections use a very small volume of solder to form joints with their mating traces or pads. This may be due to the very small spacing between joints and the danger of shorting where larger volumes of solder are to be used. The aforementioned small volume of the joints coupled with the natural wetting behavior of solder to pads and traces causes certain reliability problems in these joints. Specifically, during joining when the solder is molten and comes in contact with a pad or trace it will naturally wet [or spread out] on the surface it touches, as shown in the micrographs in FIGS. 1B and 1C. This may cause the immediate joint region to become 'solder starved' if too much of the small volume spreads away from the joint before a void-free and proper intermetallic compound can be formed. This may result in generally defective joints that perform poorly in stress tests such as temperature cycling or high temperature storage, which may in turn prevent products from achieving qualification or limit product service life.

Conventional processes may attempt to optimize the use of the NCP 125 to prevent solder wetting, which is a passive approach that creates no structural attribute to positively eliminate the possibility of flow out. In an example embodiment of the disclosure, a passivated sidewall pillar connection may utilize an identifiable layer of passivation material that is added to the sidewall of pillar connections, which may be significantly more effective than NCP optimization or surface treatments.

Figures 2A, 2B:
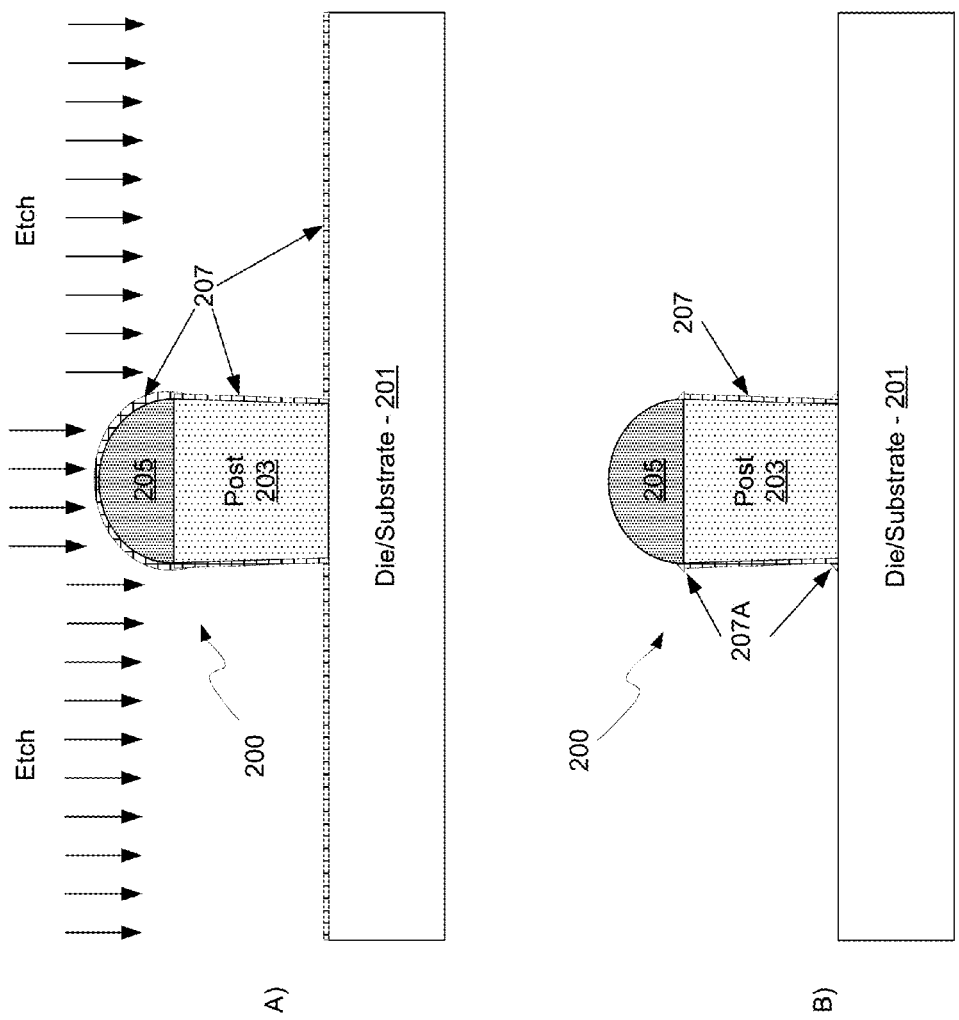
FIGS. 2A-2D illustrate fabrication steps for a passivated sidewall pillar connection, in accordance with an example embodiment of the disclosure.

FIGS. 2A-2D illustrate fabrication steps for a passivated sidewall pillar connection, in accordance with an example embodiment of the disclosure. Referring to FIG. 2A, there is shown a passivated sidewall pillar 200 comprising a post 203 and a bump 205 with a conformal layer 207, fabricated on a die/substrate 201. The post 203 may comprise a copper post, for example, similar to the post 103 in FIGS. 1A-1C, for providing electrical contact to devices in the die substrate 201. The die/substrate 201 may comprise a semiconductor die or substrate, such as a silicon CMOS die/substrate, for example, with integrated circuitry and/or devices.

The bump 205 may comprise a solder material, for example, that melts at a lower temperature than the post 203 and provides an electrical and physical connection to another post or other contact.

The conformal layer 207 may comprise a nonwettable polymer, such as parylene, for example, that may be conformally deposited on all surfaces of the post 203 and bump 205. In this manner, the top surface of the die/substrate 201 and the exposed surfaces of the post 203 and bump 205 may be covered by the polymer. The conformal layer 207 may be deposited on the finished pillar structure or at an earlier stage, such as before reflow of the bump 205.

Clean copper surfaces react with a class of chemicals, such as azole compounds, often referred to as Organic Solderability Preservatives (OSPs). OSPs protect copper against oxidation by forming a layered organic/ionic Cu surface. The earliest OSP, benzotriazole, provided limited temperature resistance and protection against oxidation. Modern OSP formulations from the chemical families of substituted benzimidazoles (alkyl benzimidazole) and substituted imidazoles (aryl-phenylimidazole) form distinct layered films on copper, allow higher temperature exposure without decomposition, and may be used with leadfree solders. OSPs may impede or prevent surface diffusion of tin on pillar surfaces and may impede or prevent the diffusion of tin to unreacted copper on pillar surfaces.

While exposed copper forms copper oxides during copper pillar processing, these oxides are stripped by flux during reflow. In an example scenario, inorganic copper surface compounds may be formed with the conformal layer 207 that are not stripped by flux or fluxing components of non-conductive paste. This inorganic copper surface protection may be combined with other structures, such as copper nail head structures or nickel barriers, for example, to minimize solder diffusion and consumption.

In an example scenario, an anisotropic etch may be utilized to remove the conformal layer 207 from each surface except for the sidewalls of the post 203. The anisotropic etch may comprise a dry etch, such as an oxygen plasma etch process, for example, that etches in the vertical direction but not in the lateral direction, or at least at a much lower rate. A wet chemical etch may be utilized in instances where the conformal layer exhibits anisotropic etching for a given etchant.

The etch process may result in the structure shown in FIG. 2B, where the horizontal surfaces have been stripped of the conformal layer 207 leaving polymer on the sidewalls of the post 203 and also the "feet" 207A at the base of the post 203 and the junction of the post 203 and the bump 205. The feet 207A may protect against undercut during a subsequent seed metal etch.

The remaining conformal layer 207 may eliminate sidewall wetting on the post 203 resulting in desired pillar connections once melted and bonded to another contact, as shown in FIG. 1C but without the need for NCP, although it may be used in the bonding process if desired.

Figures 2C, 2D:
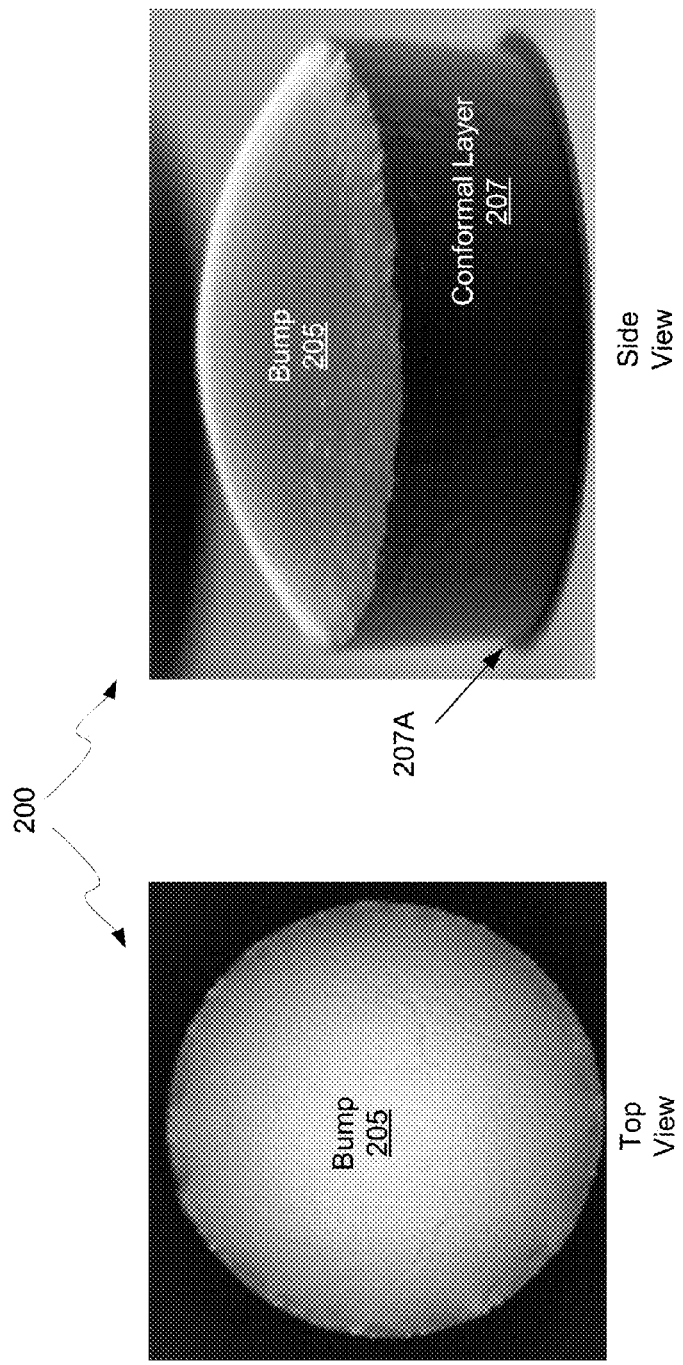

FIGS. 2C and 2D are micrographs of passivated sidewall pillars, in accordance with an example embodiment of the disclosure. Referring to FIG. 2C, there is shown a top view of a passivated sidewall pillar 200 showing the exposed bump 205. FIG. 2D shows an oblique of the passivated sidewall pillar 200 showing the exposed bump 205 where the conformal layer 207 has been removed and the remaining conformal layer 207 on the sidewall of the post 205. In addition, at the bottom of the conformal layer, the foot 207A is seen.

Figures 3A, 3B:
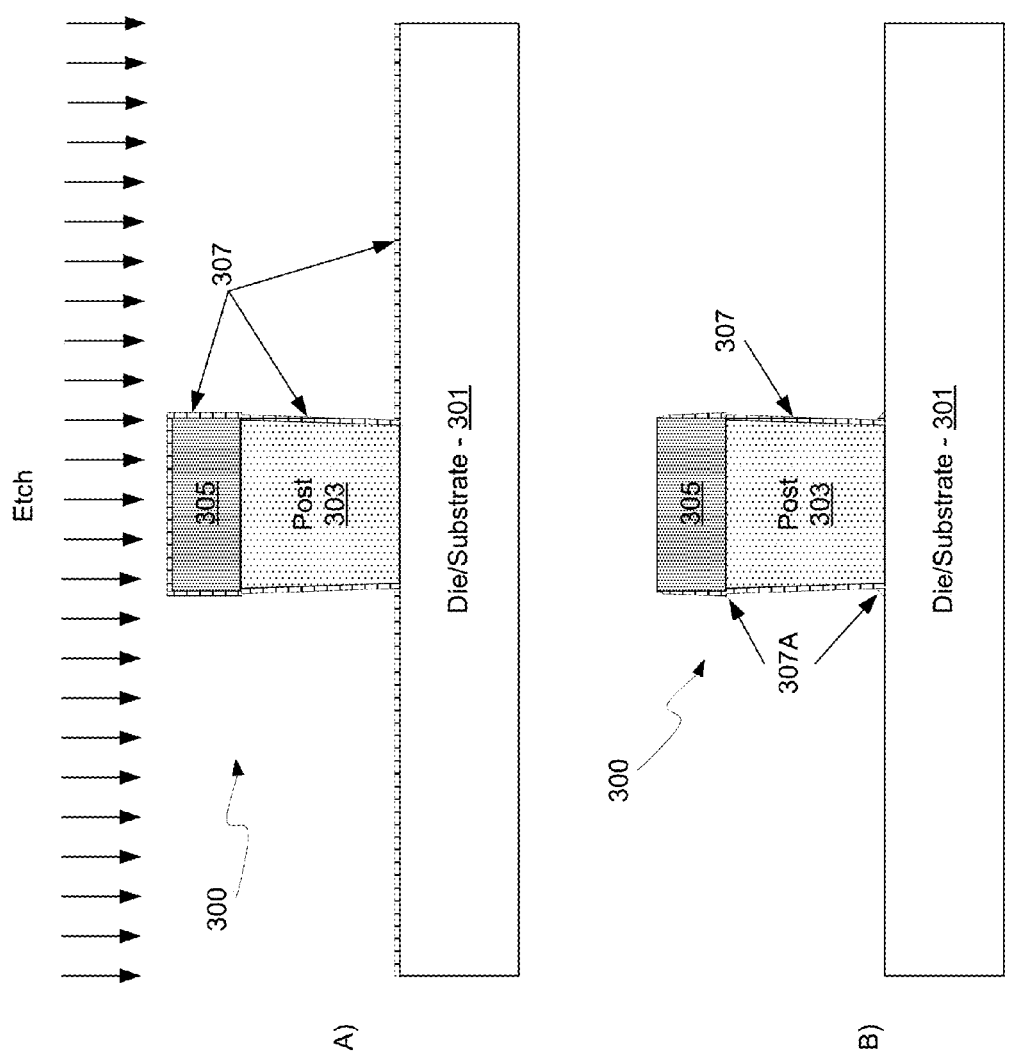
FIGS. 3A-3D illustrate alternative fabrication steps for a passivated sidewall pillar connection, in accordance with an example embodiment of the disclosure.

FIGS. 3A-3D illustrate alternative fabrication steps for a passivated sidewall pillar connection, in accordance with an example embodiment of the disclosure. Referring to FIG. 3A, there is shown a passivated sidewall pillar 300 comprising a post 303 and a bump 205 with a conformal layer 307, fabricated on a die/substrate 301. The post 303 and the die/substrate 301 may be similar to the post 203 and the die/substrate 301 described with respect to FIGS. 2A-2D. The bump 305 may be similar to the bump 205 of FIG. 2, but before a reflow process that results in a rounded shape.

The bump 305 may comprise a solder material, for example, that melts at a lower temperature than the post 303 and provides an electrical and physical connection to another post or other contact.

The conformal layer 307 may comprise a nonwettable polymer, such as parylene, for example, that may be conformally deposited on all surfaces of the post 303 and bump 305. In this manner, the top surface of the die/substrate 301 and the exposed surfaces of the post 303 and bump 305 may be covered by the polymer. The conformal layer 307 may be deposited on the post 303 and bump 305 after plating and photoresist strip steps for forming the bump 305, but before the reflow step, which is why the bump shows a rectangular cross-section at this stage.

In an example scenario, an anisotropic etch may be utilized to remove the conformal layer 307 from each surface except for the sidewalls of the post 303. The anisotropic etch may comprise a wet chemical etch or a dry etch, such as a plasma etch process, for example.

The etch process may result in the structure shown in FIG. 3B, where the horizontal surfaces have been stripped of the conformal layer 307 leaving polymer on the sidewalls of the post 303 and also the feet 307A at the base of the post 303 and the junction of the post 303 and the bump 305. The feet 307A may protect against undercut during a subsequent seed metal etch.

Figures 3C, 3D:
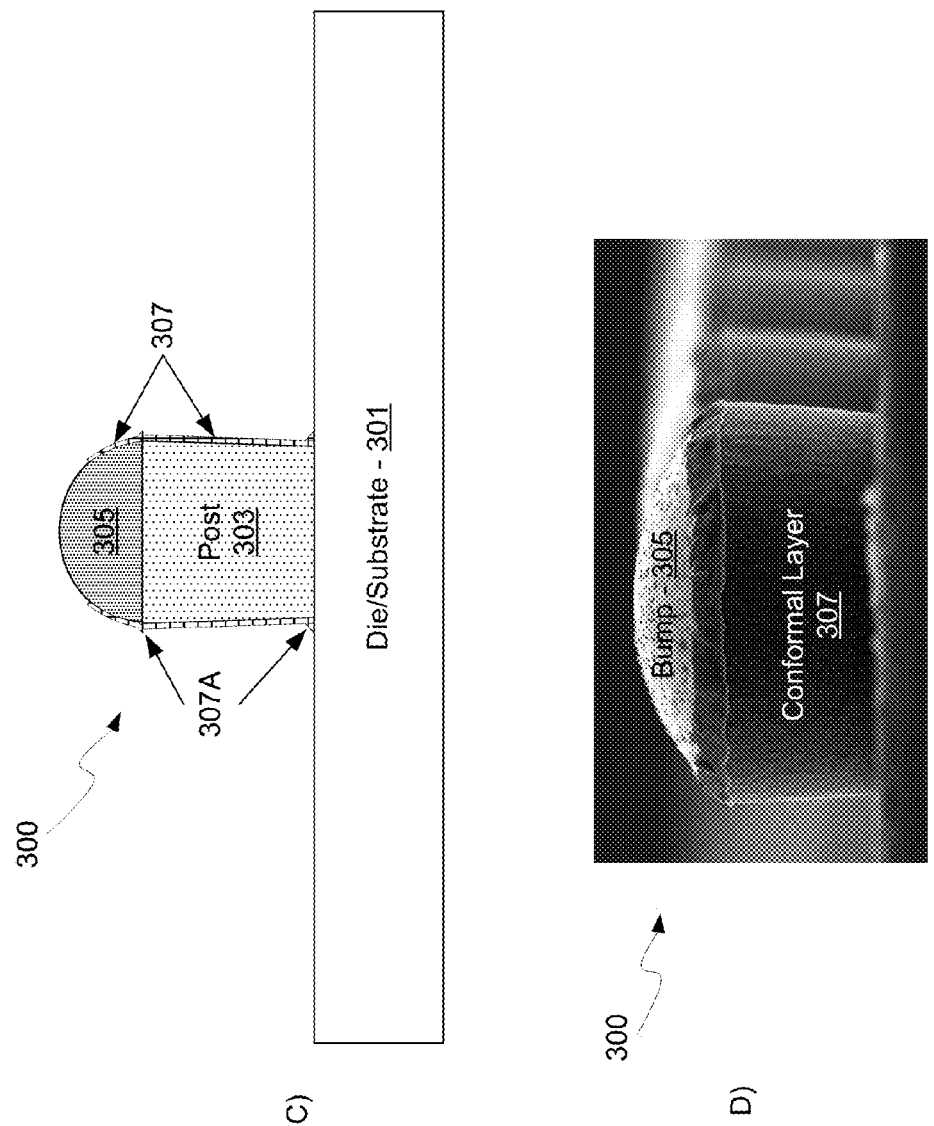

FIGS. 3C and 3D illustrate a passivated sidewall pillar following reflow, in accordance with an example scenario of the disclosure. The pillar structure following anisotropic etch shown in FIG. 3B may be subjected to a reflow process that melts the bump resulting in a rounded shape, as shown in FIG. 3C. The conformal layer 307 remains on the vertical sidewall of the post 303. Upon reflow, the polymer in contact with the bump 305 may remain adhered to tin oxide in the bump 305, which thus is prevented from being reduced by a subsequent flux process and conforms to the shape of the molten solder.

The remaining conformal layer 307 may eliminate sidewall wetting on the post 303 resulting in desired pillar connections once melted and bonded to another contact, as shown in FIG. 1C but without the need for NCP, although it may be used in the bonding process if desired.

FIG. 3D is a micrograph showing the resulting passivated sidewall pillar 300 with the post-reflow bump 305 and the remaining conformal layer 307 that has conformed to the shape of the bump after reflow. The remaining conformal layer 307 may act as a block to sidewall wetting during a subsequent bonding process with another contact.

Figures 4A, 4B:
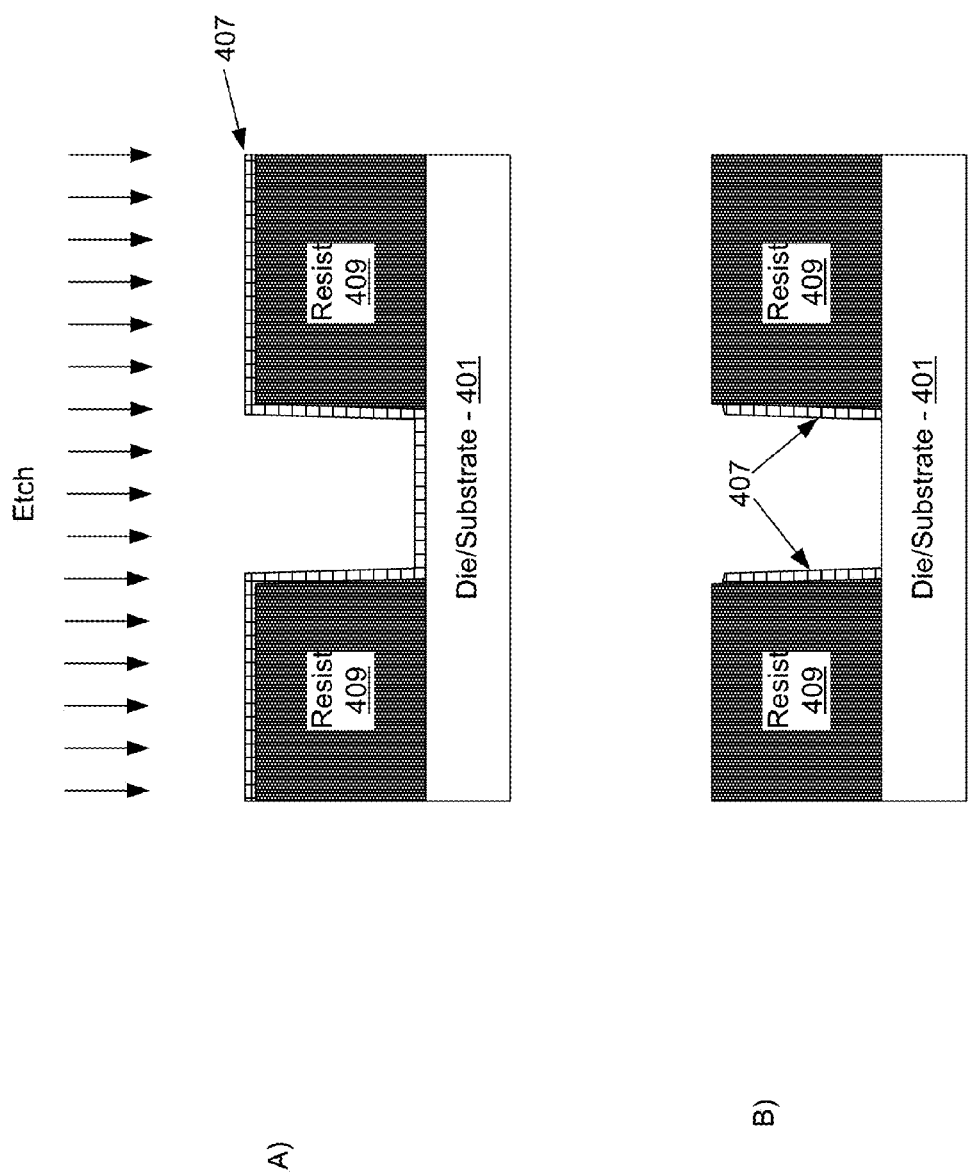
FIGS. 4A-4C illustrate a conformal layer deposition process prior to pillar formation, in accordance with an example embodiment of the disclosure.
Figure 4C:
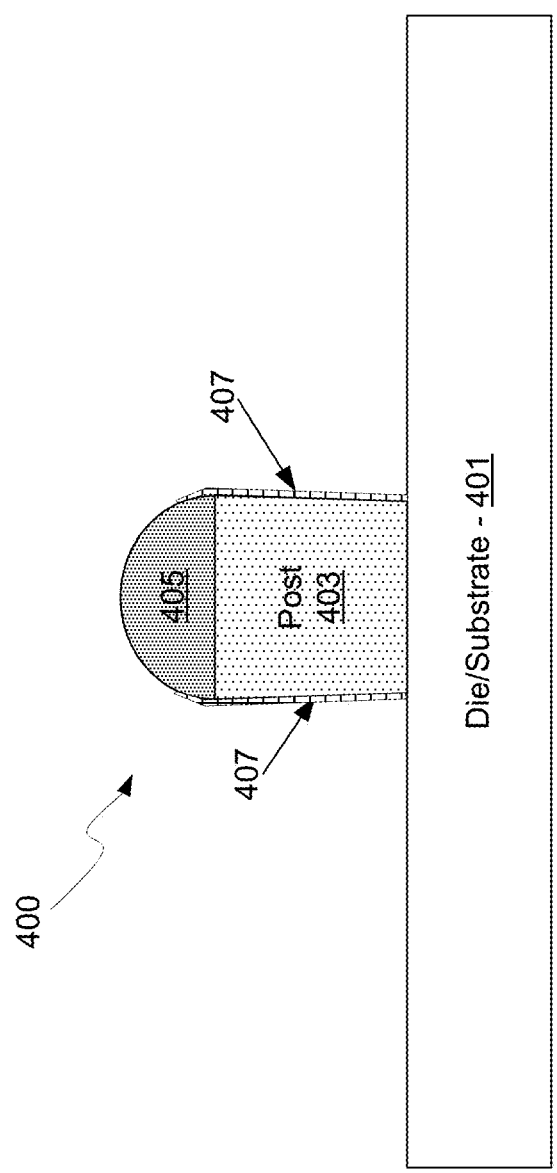

FIGS. 4A-4C illustrate a conformal layer deposition process prior to pillar formation, in accordance with an example embodiment of the disclosure. Referring to FIG. 4A, there is shown a die/substrate 401, photoresist layer 409, and a conformal layer 407. The die/substrate 401 and the conformal layer 407 may be similar to the die/substrate 301 and conformal layer 307 described previously.

The photoresist layer 409 may comprise photoresist that has been formed on the die/substrate 401, patterned, developed, and removed in regions where passivated sidewall pillars are to be formed. The conformal layer 407 may then be deposited on the patterned photoresist layer 409, resulting in the structure shown in FIG. 4A. An anisotropic etch may be performed on the conformal layer 407, thereby removing the horizontal surfaces of polymer, leaving only the vertical sidewalls within the photoresist layer 409.

The patterned photoresist layer 409 may provide cylindrical volumes where metal may be formed utilizing plating processes, for example, for forming pillars within. For example, plating copper and solder plating processes may be utilized to form posts and bumps in the patterned photoresist layer 409 such that the remaining conformal layer extends partially up the side of the deposited bump metal, followed by a reflow process and photoresist strip, resulting in a passivated sidewall pillar as shown in FIG. 4C. Other suitable metal forming processes may also be utilized, such as evaporation, chemical vapor deposition, etc. In another example scenario, the process described for FIGS. 4A-4C may result in a "barrel" shaped post 403, being wider in the middle and narrower at the top and the bottom of the post.

FIG. 4C shows a passivated sidewall pillar formed with conformal layer deposition prior to pillar formation, in accordance with an example embodiment of the disclosure. As shown in FIG. 4C, the conformal layer 407 remains on the vertical sidewalls of the post 403 and partially up the side of the bump 405. And similar to FIGS. 3C and 3D, the conformal layer 407 may be adhered to the tin oxide in the bump 405 and thus conforms to the shape of the reflowed solder, resulting in a similar structure to that shown in FIGS. 3C and 3D.

Figures 5A, 5B:
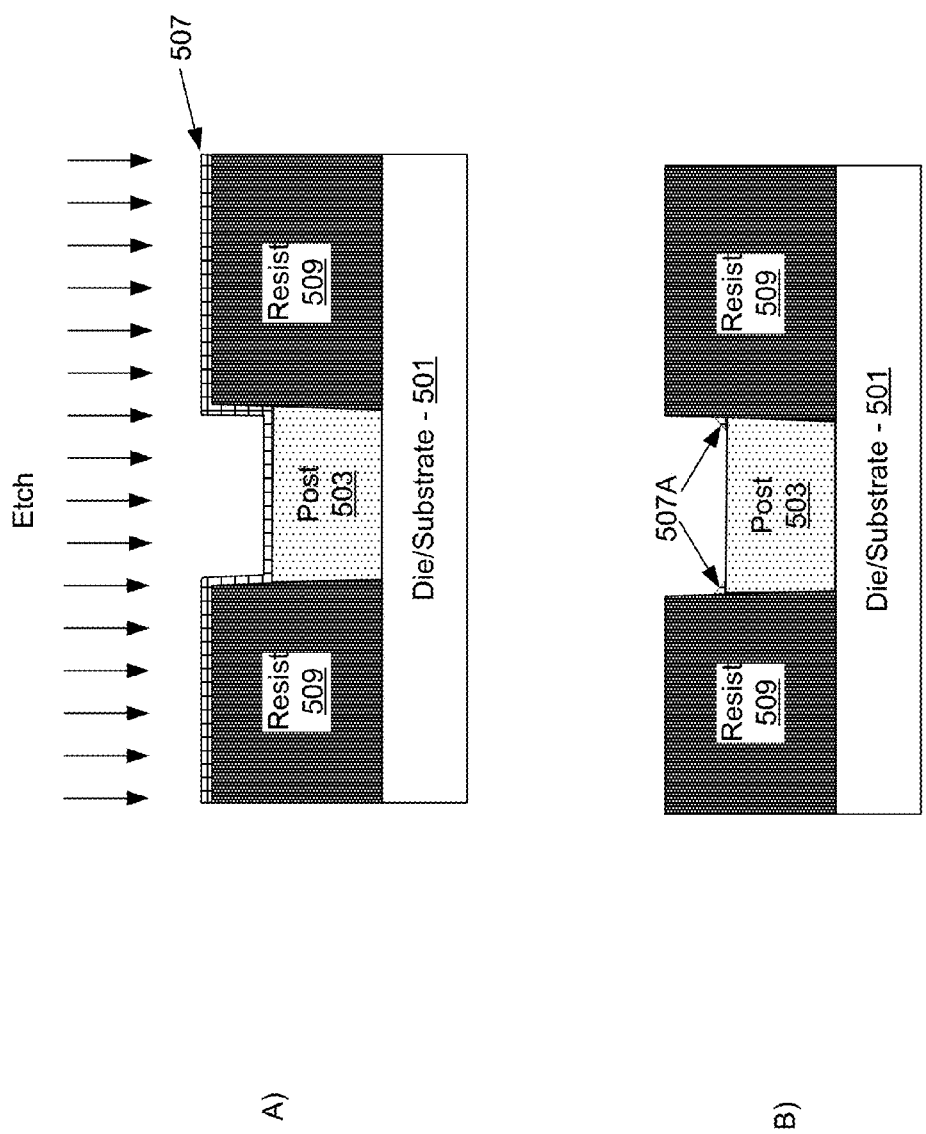
FIGS. 5A-5D illustrate steps in forming a pillar structure with a solder dam, in accordance with an example embodiment of the disclosure.

FIGS. 5A-5D illustrate steps in forming a pillar structure with a solder dam, in accordance with an example embodiment of the disclosure. Referring to FIG. 5A, there is shown a die/substrate 501, a post 503, a conformal layer 507, and photoresist layer 509. The die/substrate 501, the post 503, and the conformal layer 507 may be similar to die/substrates, posts, and conformal layers discussed previously.

FIG. 5A shows the structure after photoresist has been deposited on the die/substrate 501 and patterned with openings where a pillar is to be formed. Also, a metal plating process has been performed filling the exposed regions in the photoresist layer 509, resulting in the post 503. The metal may comprise copper or other desired contact metal, for example.

Finally, a conformal layer 507 may be deposited over the photoresist layer 509 and the post 503, resulting in the structure shown in FIG. 5A. An anisotropic etch process, wet or dry, may be performed to remove the conformal layer 507 from horizontal surfaces. Because the etch ion trajectories are not all vertical, the polymer near the photoresist layer 509 sidewalls may be somewhat protected and etches slower so the corners clear last. Thus, the corners may be left intact, leaving a ring 507A of the conformal layer 507 at the top of the post 503.

Figures 5C, 5D:
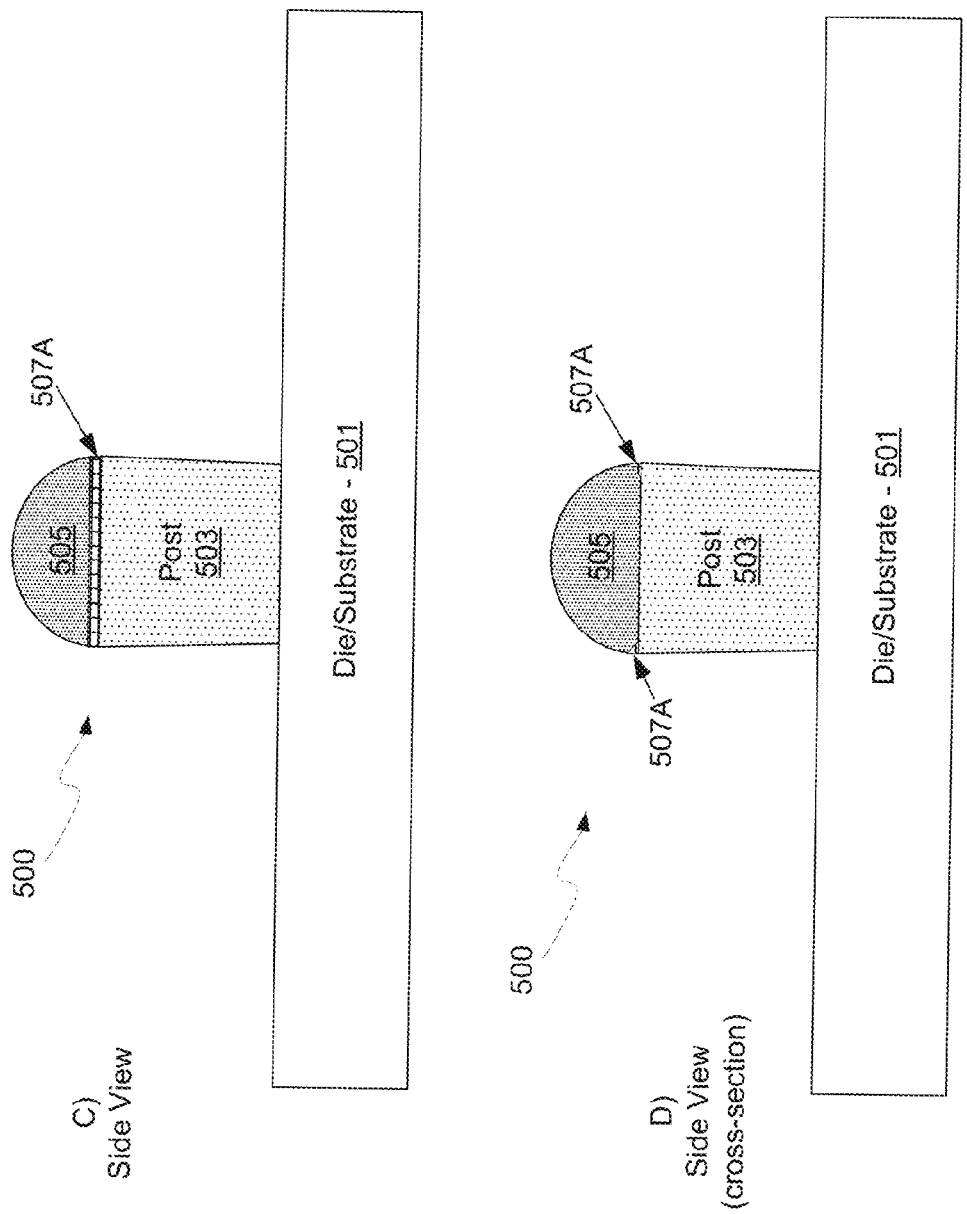

Solder may be plated over the exposed post 503 and the conformal layer ring 507A to form a solder bump, after which the photoresist layer 509 may be removed and the plated solder metal may be subjected to a reflow process resulting in the bump 505 as shown in FIG. 5C. The remaining conformal layer in the ring 507A may remain through these processes, forming a barrier to solder wetting onto the post 503, without completely covering the sidewalls of the post 503.

Figures 6A, 6B, 6C:
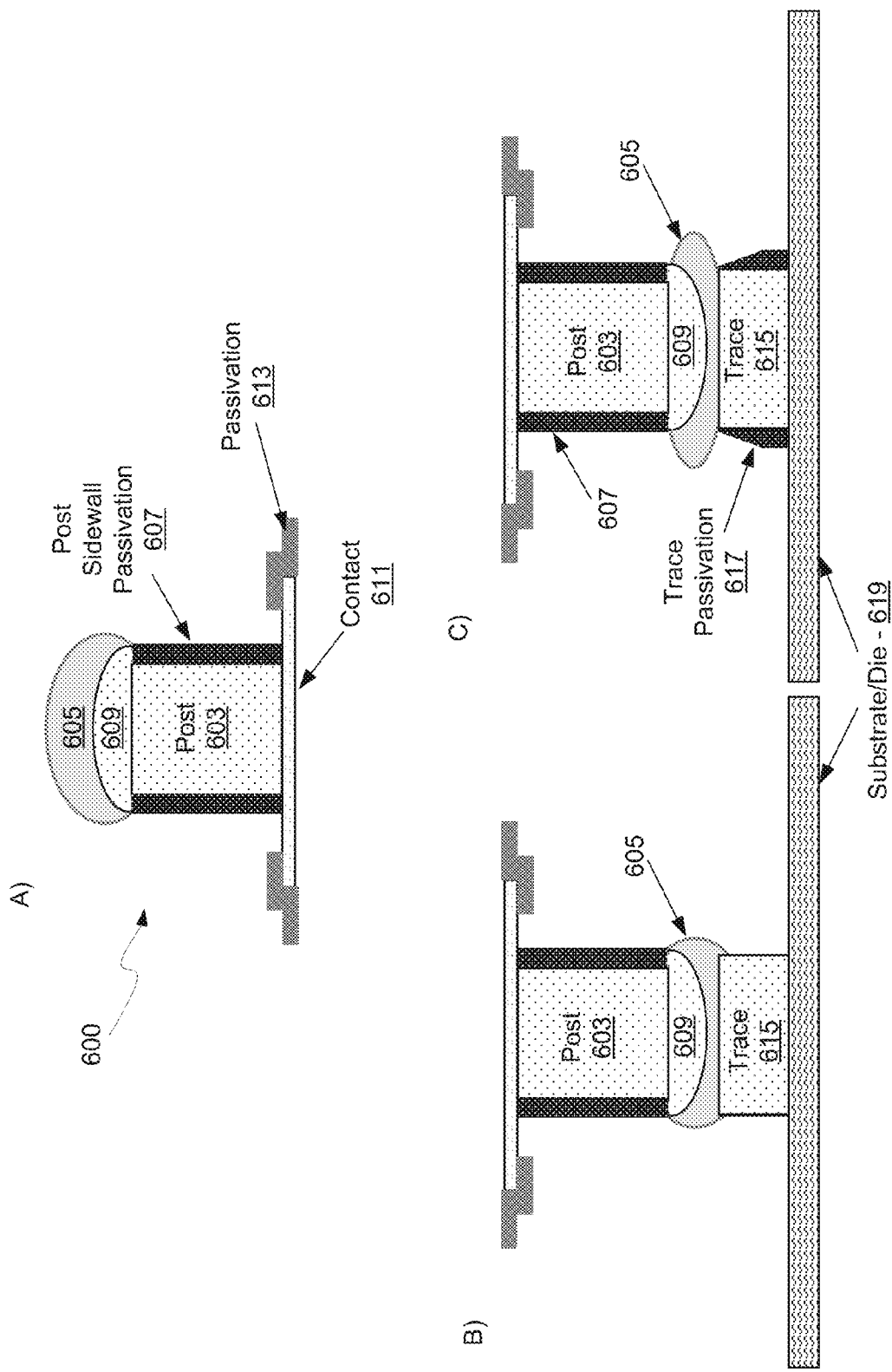
FIGS. 6A-6C illustrate passivated sidewall pillar connections, in accordance with an example embodiment of the disclosure.

FIGS. 6A-6C illustrate passivated sidewall pillar connections, in accordance with an example embodiment of the disclosure. Referring to FIG. 6A, there is shown a passivated pillar 600 comprising a post 603, a bump 605, post sidewall passivation 607, a "mushroom shaped head" or cap 609, a contact 611, and contact passivation 613. The "mushroom head" shape of the passivated pillar 600 results from the process steps shown in FIGS. 7A-7H, where the cylindrical post 603 is narrower than the cap 609, which is circular when viewing from above the structure. It should be noted that the cap 609 is optional and the bump 605 may be formed directly on the post 603.

The contact 611 may comprise a metal pad formed on an integrated circuit die or substrate to which the passivated pillar 600 provides contact and the passivation layer 613 may comprise a dielectric material providing electrical isolation and physical protection for the contact 611.

The post sidewall passivation 607 may comprise a conformal passivation layer, such as those described with respect to FIGS. 2-5, and may comprise a polymer material, for example. The post sidewall passivation 607 may eliminate sidewall wetting when the passivated pillar 600 is bonded to another contact, such as the traces 615 shown in FIGS. 6B and 6C, which may comprise copper traces on a substrate or die 619, for example.

FIG. 6B illustrates the passivated pillar 600 bonded to the trace 615 without sidewall passivation. While the post sidewall passivation 607 prevents solder wetting to the post 603 during bonding, as shown by the well-formed bump 605 between the post 603 and the trace 615 after reflow, there is still the possibility of wetting to the side of the trace 615.

Wetting of the bump 605 to the trace 615 may be prevented by adding a passivation layer to the trace, so that both sides of the contacts would then have passivated sidewalls and only exposed metal of the cap 609 and the trace 615 would be wetted to by the bump 605 during reflow, as shown in the resulting structure of FIG. 6C.

Figures 7A, 7B, 7C, 7D, 7E, 7F:
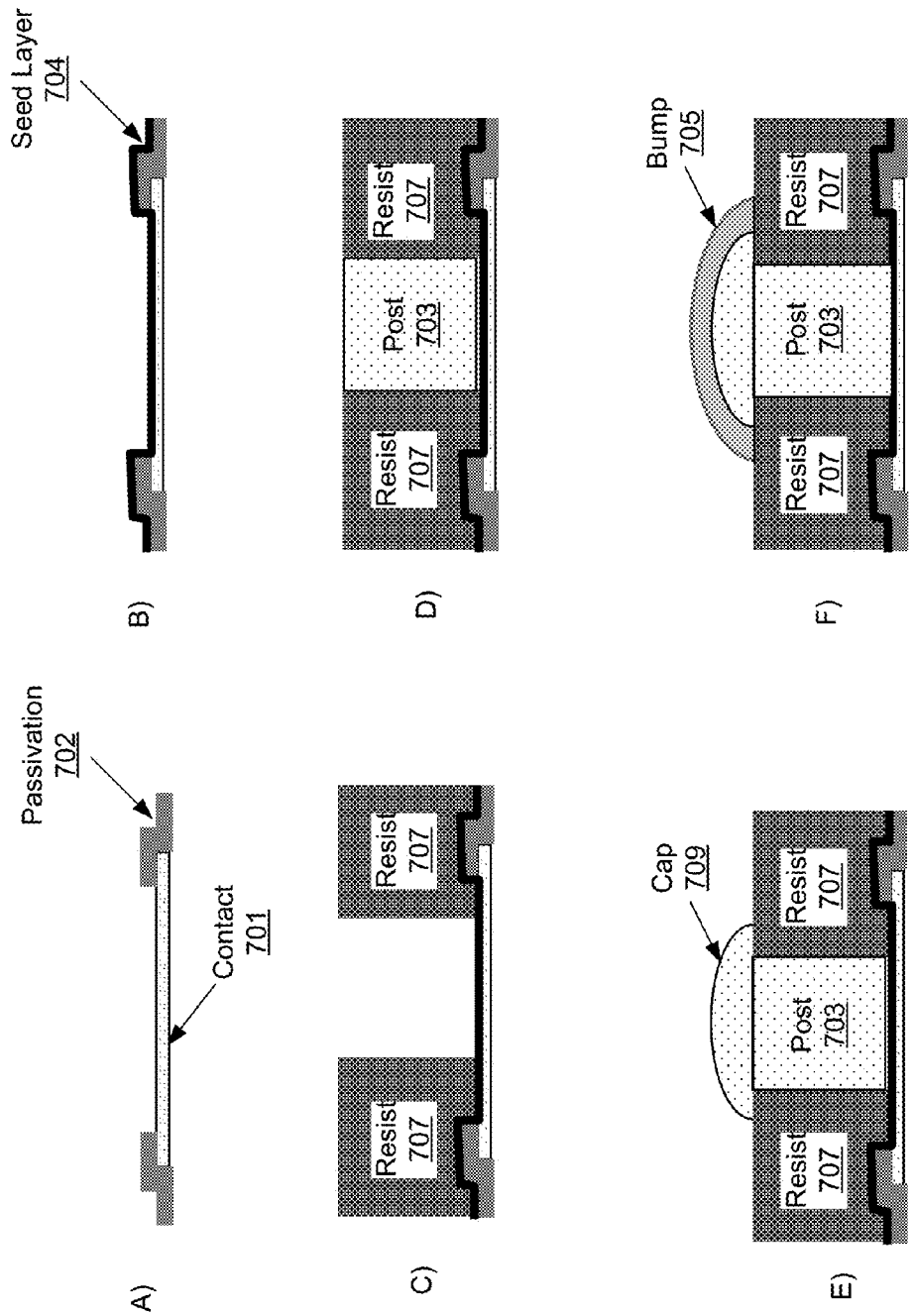
FIGS. 7A-7N illustrate processing steps for a mushroom-head passivated sidewall pillar connection, in accordance with an example embodiment of the disclosure.
Figures 7G, 7H, 7I, 7J:
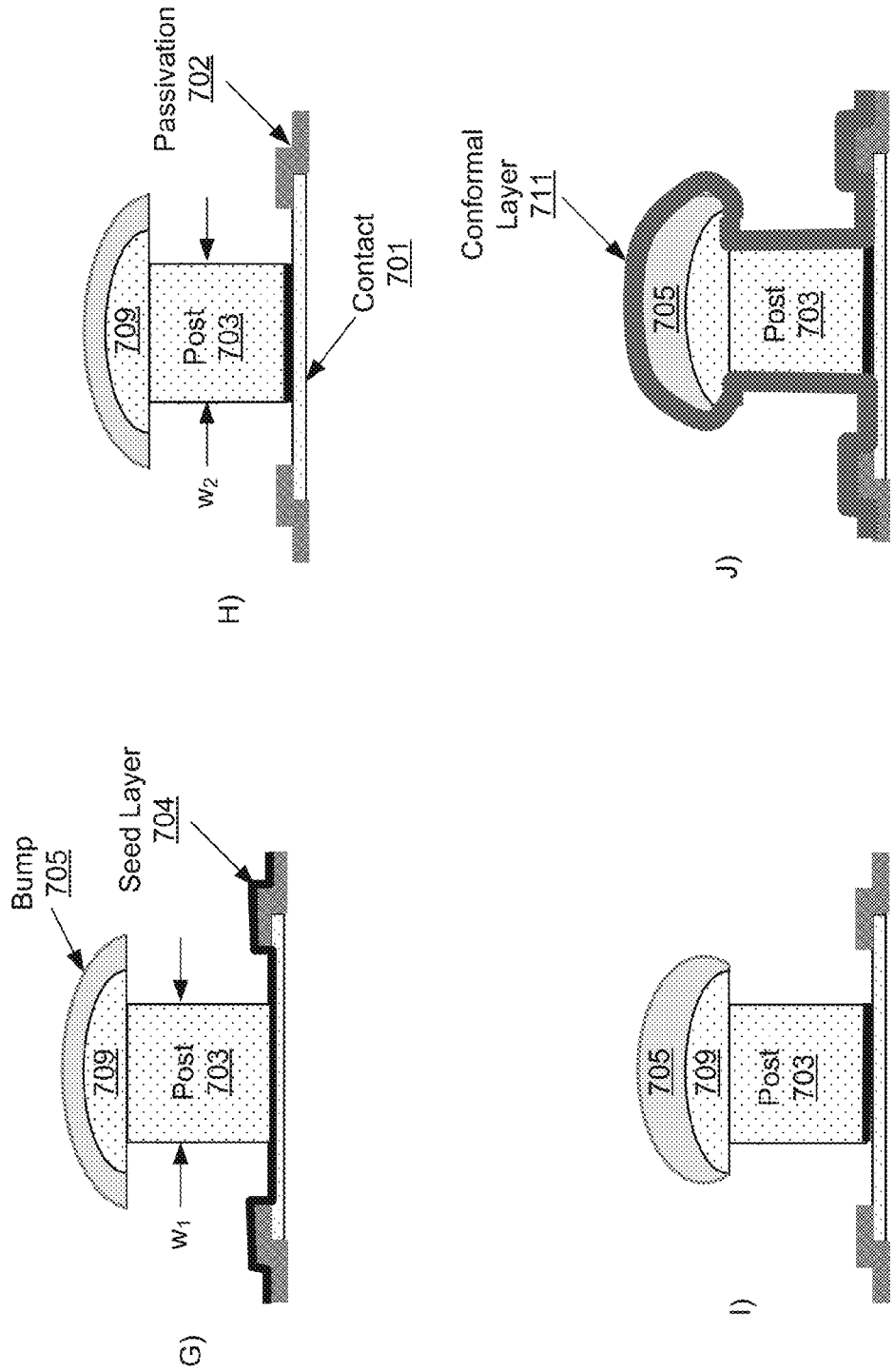
Figures 7K, 7L, 7M, 7N:
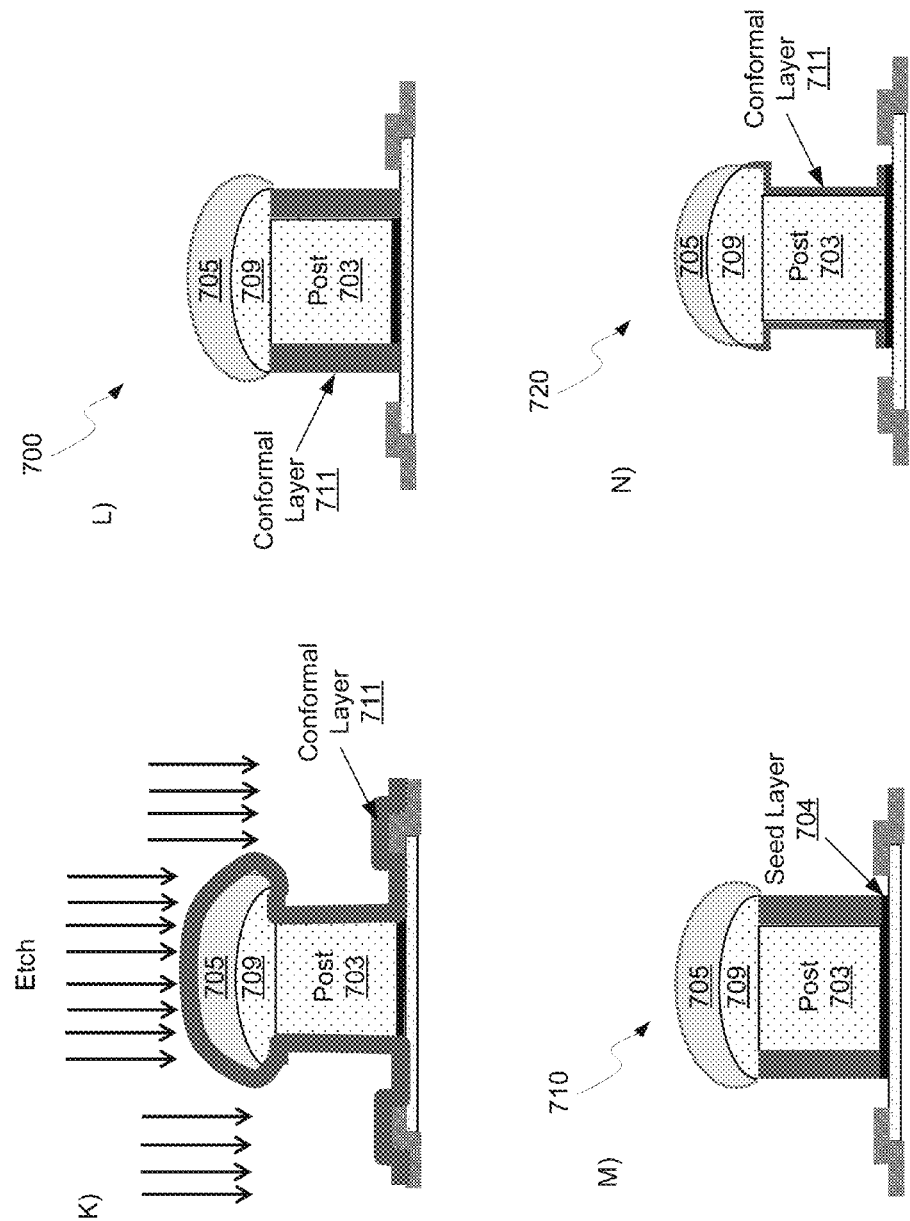

FIGS. 7A-7N illustrate processing steps for a mushroom-head passivated sidewall pillar connection, in accordance with an example embodiment of the disclosure. Referring to FIG. 7A, there is shown a contact 701 to which a pillar connection is to be formed, and a passivation layer 702 that electrically isolates and provides physical protection for the contact 701.

In FIG. 7B, a seed layer may be deposited over the exposed portion of the contact 701 and on the passivation layer 702. The seed layer 704 may comprise a metal alloy that enhances the electrical contact of a post, such as a copper post, to the contact 701. In an example scenario, the seed layer 704 may comprise thin layers of sputtered titanium, tungsten, and copper (e.g., a TiW layer and a Cu layer), although other metals and deposition techniques may be utilized.

FIG. 7C illustrates the structure after a photoresist layer 707 has been applied and patterned with portions of the contact 701 exposed. The photoresist layer 707 may be spun on, exposed to UV light through a mask pattern, and developed, to provide the patterned photoresist layer 707 shown. A metal plating process may then proceed, filling in the patterned photoresist layer 707 and forming a post 703 on the exposed portion of the contact 701, as shown in FIG. 7D. Accordingly, the thickness of the photoresist layer 707 may be configured to control the height of the resulting post 703.

A mushroom plating may be performed on the structure shown in FIG. 7D, where copper, for example, may be plated on the exposed surface of the post 703 and a portion of the photoresist layer 707, forming a rounded "mushroom-shaped" cap 709 on top of the cylindrical post 703, as shown in FIG. 7E. A second mushroom plating may be performed, resulting in the bump 705 as illustrated in FIG. 7F. The bump 705 may comprise a solder material, for example, that melts at a lower temperature than the post 703 and the cap 709. It should be noted that the cap 709 is optional and the bump 705 may be formed directly on the post 703.

The photoresist layer 707 may be removed to expose the seed layer 704 not covered by the post 703, and also expose the sidewalls of the post 703 and the underside of the bump 705 and the cap 709, as shown in FIG. 7G. Next, the exposed portion of the seed layer 704 may be removed via etching, for example, exposing the top surface of the contact 701 not covered by the post 703 and the remaining seed layer 704, and also exposing the top surface of the passivation layer 702, as illustrated in FIG. 7H In addition, the seed layer 704 may optionally be overetched, thereby reducing the width of the post 703 so that $w_2<w_1$.

A reflow process may round the shape of the bump 705 on the cap 709, resulting in the structure shown in FIG. 7I. The exposed surfaces of the contact 701, the passivation 702, the post 703, the bump 705, and the cap 709 may then be coated with a conformal layer 711, which may be similar to the conformal layers described previously, and may comprise a polymer, for example. The resulting structure is shown in FIG. 7J.

An anisotropic etch may then be utilized to remove horizontal surfaces of the conformal layer 711, as illustrated in FIG. 7K and resulting in the structure shown in FIG. 7L. The anisotropic etch may comprise a wet chemical etch or a dry etch, such as a plasma etch, for example, that etches in the vertical direction but not in the lateral direction, or at least at a much lower rate. In another example scenario, the seed layer etch described above for FIG. 7H may be skipped until after the etching of the conformal passivation shown in FIG. 7K, thereby leaving a portion of the seed layer 704, as shown in FIG. 7M. Remaining seed layer 704 outside the diameter of the post 703 may result in greater surface area for improved electrical contact and increased physical strength of the resulting bond.

In yet another example scenario, the conformal passivation layer 711 may be thinner than the width of the extension of the cap 709 over the post 703, such that the layer follows the contours of the horizontal surfaces of the cap 709 and the seed layer 704, as shown in FIG. 7N. In this example, the height of the cap 709 is higher than other embodiments shown, so the conformal layer 711 also covers side surfaces of the cap 709.

Furthermore, the conformal layer shown in FIG. 7N may be formed in a different process than the deposition/anisotropic etch described previously. In an alternative process, the conformal layer 711 may be formed directly on the exposed copper surfaces of the post 703 and/or the cap 709, such as when the structure is as shown in FIG. 7I, utilizing OSPs and related compounds described previously.

Figures 8A, 8B, 8C, 8D:
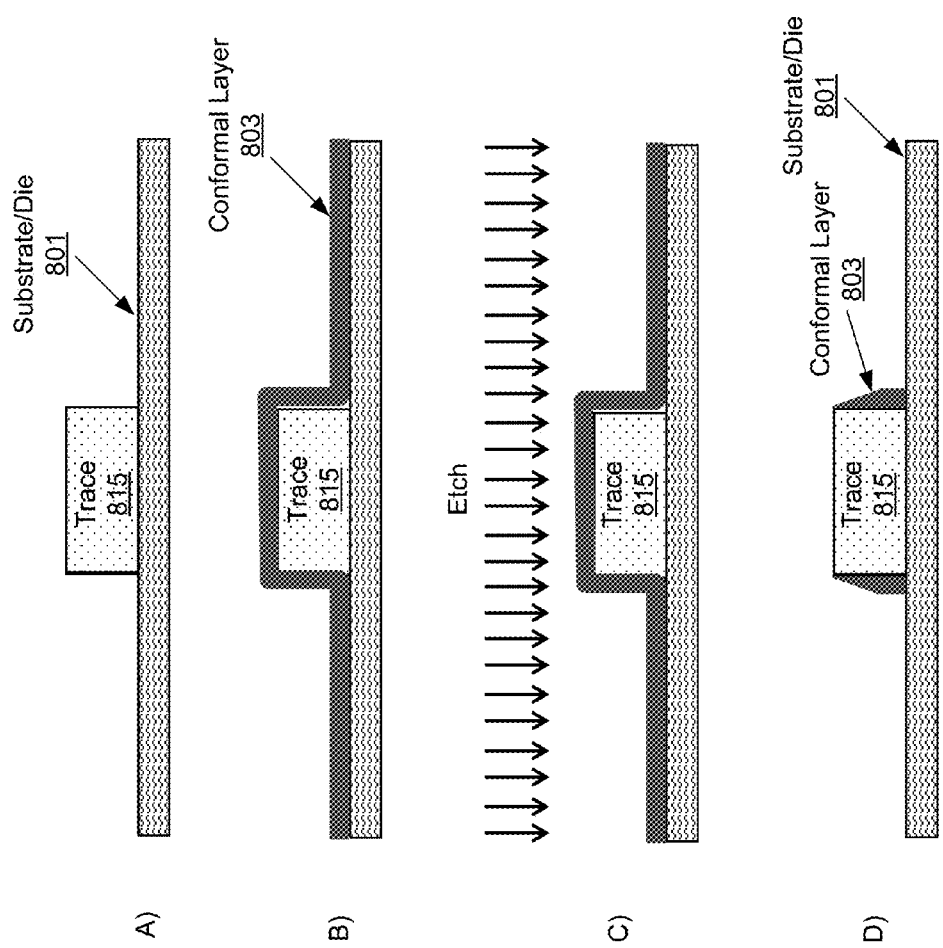
FIGS. 8A-8D illustrate process steps in forming a passivated sidewall trace, in accordance with an example embodiment of the disclosure.

FIGS. 8A-8D illustrate process steps in forming a passivated sidewall trace, in accordance with an example embodiment of the disclosure. Referring to FIG. 8A, there is shown a trace 815 on a substrate/die 801. The trace 815 may comprise a copper trace, for example, to provide electrical connection to the substrate or die on which it is formed. The substrate/die 801 may comprise a packaging substrate, a semiconductor die, an interposer die or wafer, or printed circuit board, for example, comprising devices and/or interconnects to which the trace 815 is coupled to and are to be connected to external devices.

The trace 815 and exposed portion of the substrate/die 801 may be covered with a conformal layer 803, as shown in FIG. 8B. The conformal layer 803 may be similar to the conformal layers described previously, and in an example scenario, comprises a polymer layer that prevents solder wetting of surfaces it covers.

An anisotropic etch may then be utilized to remove horizontal surfaces of the conformal layer 803, as illustrated in FIG. 8C and resulting in the structure shown in FIG. 8D. The anisotropic etch may comprise a wet chemical etch or a dry etch, such as a plasma etch, for example, that etches in the vertical direction but not in the lateral direction, or at least at a much lower rate. The remaining conformal layer 803 in FIG. 8D covers the sidewalls of the trace 815, which prevents sidewall wetting when bonding to a solder bump and subjected to a reflow process.

Figures 9A, 9B, 9C, 9D, 9E:
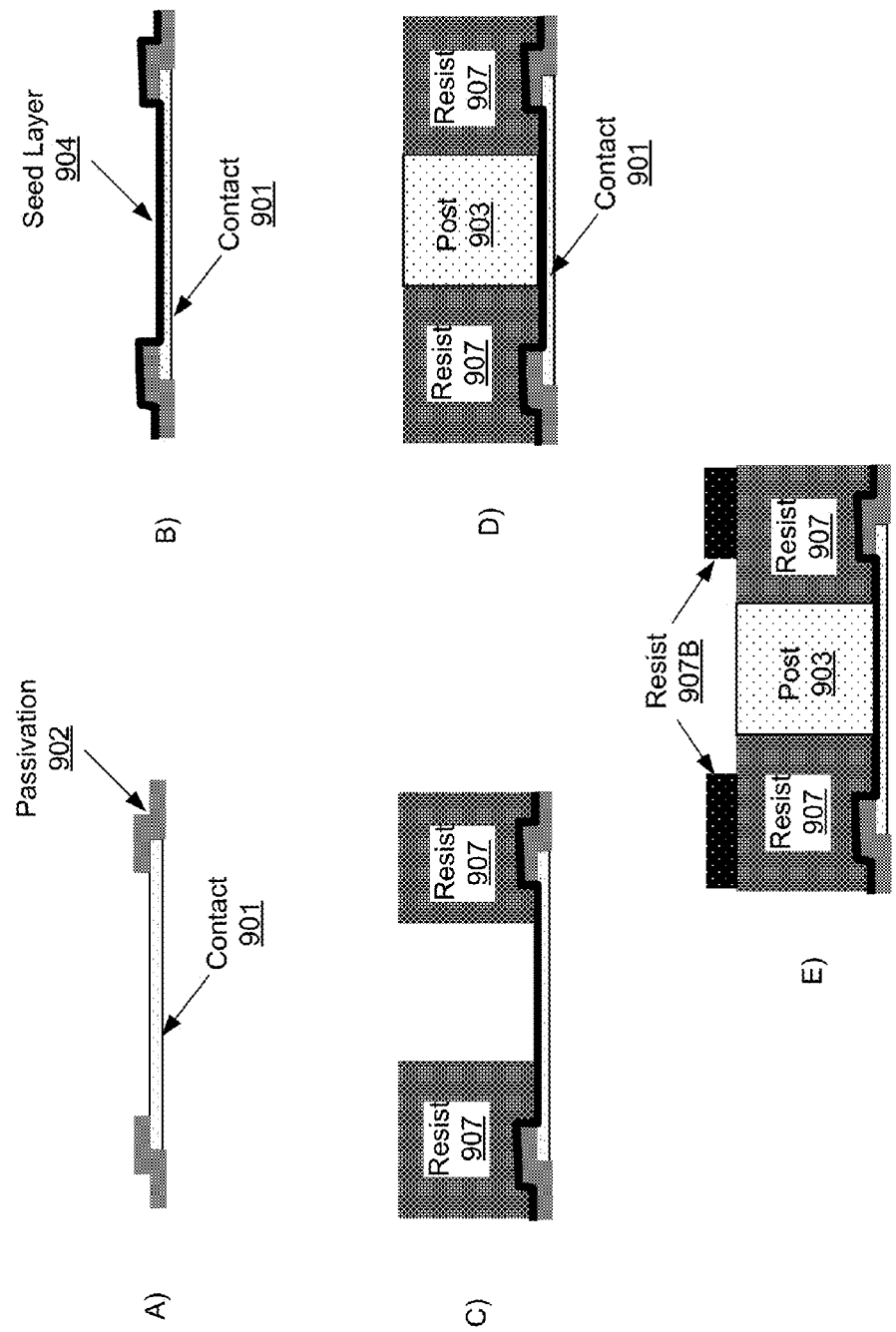
FIGS. 9A-9H illustrate processing steps for a nail-head passivated sidewall pillar connection, in accordance with an example embodiment of the disclosure.

FIGS. 9A-9H illustrate processing steps for a nail-head passivated sidewall pillar connection, in accordance with an example embodiment of the disclosure. Referring to FIG. 9A, there is shown a contact 901 to which a pillar connection is to be formed, and a passivation layer 902 that electrically isolates and provides physical protection for the contact 901.

In FIG. 9B, a seed layer may be deposited over the exposed portion of the contact 901 and on the passivation layer 902. The seed layer 904 may comprise a metal alloy that enhances the electrical contact of a post, such as a copper post, to the contact 901. In an example scenario, the seed layer 904 may comprise thin layers of sputtered titanium, tungsten, and copper (e.g., a TiW layer and a Cu layer), although other metals and deposition techniques may be utilized.

FIG. 9C illustrates the structure after a photoresist layer 907 has been applied and patterned with portions of the contact 901 exposed. The photoresist layer 907 may be spun on, exposed to UV light through a mask pattern, and developed to provide the patterned photoresist layer 907 shown. A metal plating process may then proceed, e.g. copper or tin/silver, filling in the patterned photoresist layer 907 and forming a post 903 on the exposed portion of the contact 901, as shown in FIG. 9D. Accordingly, the thickness of the photoresist layer 907 may be configured to control the height of the resulting post 903.

Figures 9F, 9G, 9H:
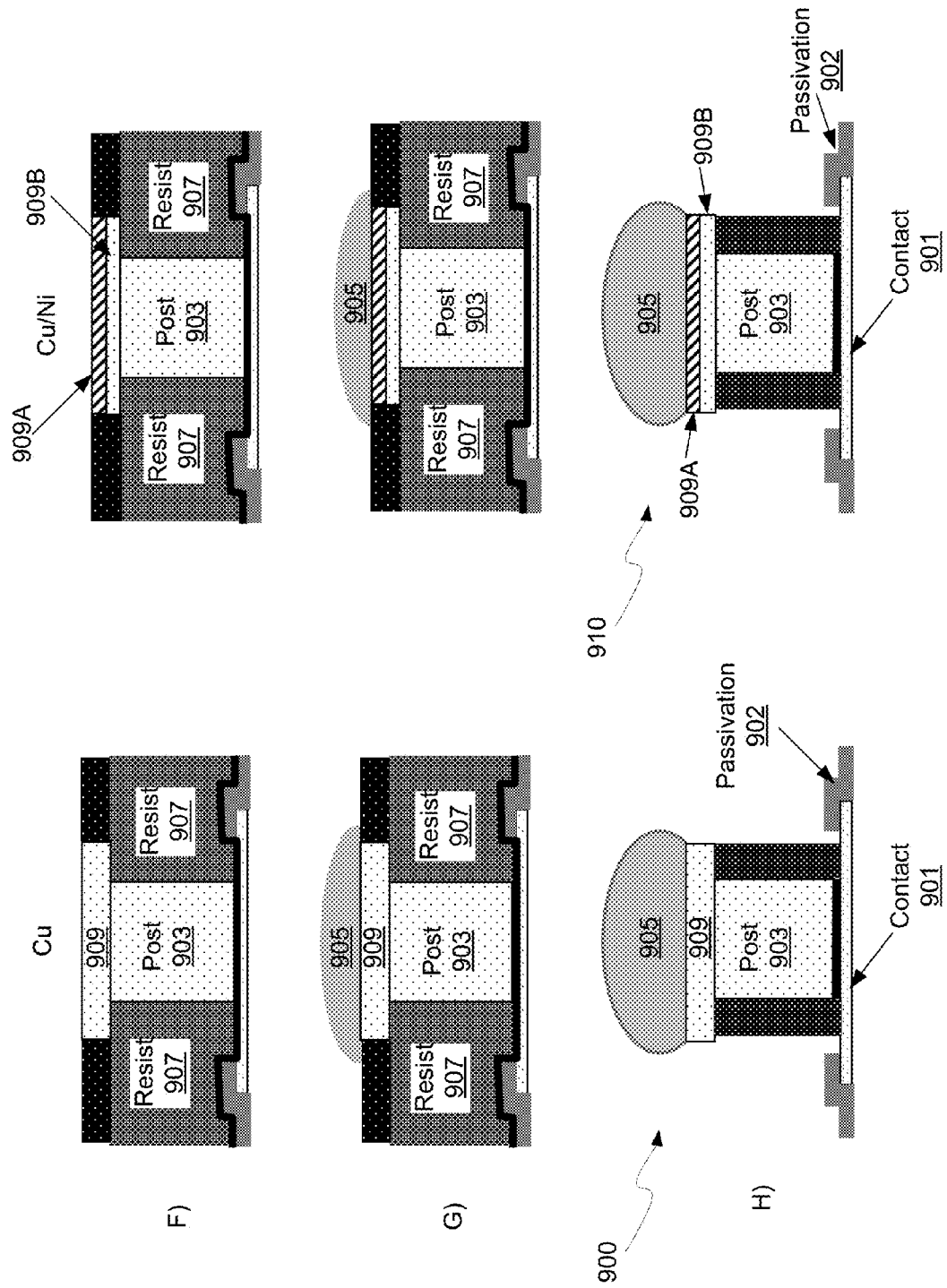

A second photoresist layer 907B may be formed on the photoresist layer 907 and patterned to leave an opening above the post 903 with a width that is wider than the post, as shown in FIG. 9E. One or more plating steps may proceed, filling in the region above the post and partially on the photoresist layer 907. FIGS. 9F-9H show two parallel processes, the left structure with a single plating step, such as a copper plating, resulting in the "nail head" structure shown in the left portion of FIG. 9F, where the head 909 may be rectangular in cross-section and circular in shape when looking down. Similarly, a two-step plating process, such as a copper/nickel plating process, may also fill in the region above the post 903 and the photoresist layer 907, resulting in the nail head, or metal cap structure shown in the right portion of FIG. 9F, but with two metals 909A and 909B. It should be noted that the cap metals 909, and 909A/909B are optional and the bump 905 may be formed directly on the post 903.

A solder plating process may be performed on the nail head structures of FIG. 9F, resulting in the bumps 905 as illustrated in FIG. 9G. The bump 905 may comprise a solder material, for example, that melts at a lower temperature than the post 903 and the cap 909/909A/909B.

The photoresist layer 907 may be removed to expose the seed layer 904 not covered by the post 903, and also exposing the sidewalls of the post 903 and the underside of the bump 905 and the cap 909/909B, similar to FIG. 7G Next, the exposed portion of the seed layer 904 may be removed via etching, for example, exposing the top surface of the contact 901 not covered by the post 903 and the remaining seed layer 904, and also exposing the top surface of the passivation layer 902, similar to the structure shown FIG. 7H In addition, the seed layer 904 may optionally be overetched, thereby reducing the width of the post 903.

A reflow process may round the shape of the bump 905 on the cap 909/909A/909B. The exposed surfaces of the contact 901, the passivation 902, the post 903, the bump 905, and the cap 909/909A/909B may then be coated with a conformal layer, which may be similar to the conformal layers described previously, and may comprise a polymer, for example. The resulting structure may be similar to that shown in FIG. 7J.

An anisotropic etch may then be utilized to remove horizontal surfaces of the conformal layer, resulting in the passivated sidewall nail head structures 900 and 910 shown in FIG. 9H. The anisotropic etch may comprise a wet chemical etch or a dry etch, such as a plasma etch, for example, that etches in the vertical direction but not in the lateral direction, or at least at a much lower rate.

Figure 10:
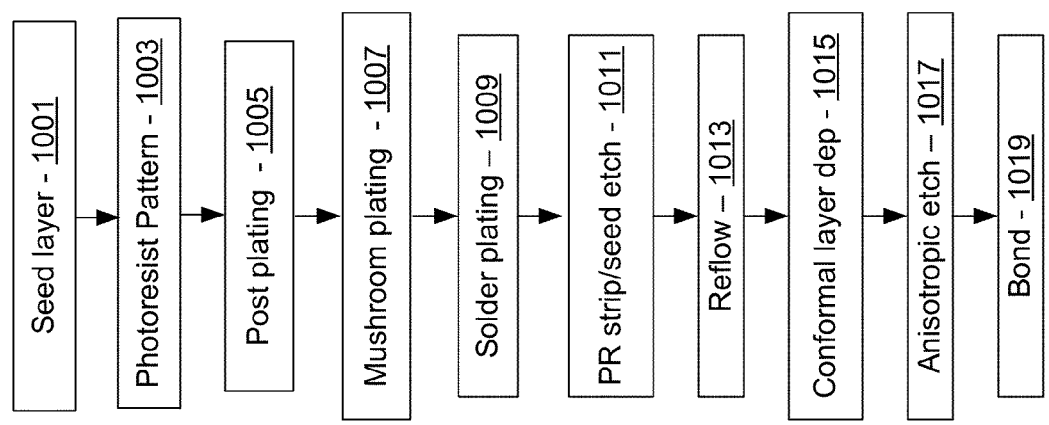
FIG. 10 is a flow chart illustrating example steps for a mushroom-head passivated sidewall pillar connection, in accordance with an example embodiment of the disclosure.

FIG. 10 is a flow chart illustrating example steps for a mushroom-head passivated sidewall pillar connection, in accordance with an example embodiment of the disclosure. The process described in FIG. 10 may correspond to the process described with respect to FIGS. 7A-7L, for example. In the first step 1001, a seed layer may be deposited on a contact and a passivation layer that partially covers the contact. In step 1103, a photoresist pattern may be formed on the seed layer with openings formed over a portion of the contact.

In step 1005, a metal plating process, such as copper plating, may fill the openings in the photoresist pattern to form a post, such that the height of the post may be closely associated with the photoresist thickness. In step 1007, another plating step may form a mushroom shape cap on the post, and in step 1009, a solder plating may form a solder bump on the formed post and mushroom head.

In step 1011, the photoresist layer may be removed and the exposed seed layer may be etched. In an example scenario, the seed layer may be overetched, resulting in a post with smaller diameter, increasing the aspect ratio between the mushroom head and post diameters.

In step 1013, the solder may be subjected to a reflow process, resulting in a more rounded structure on top of the post, followed by a conformal layer deposition in step 1015, with the conformal layer comprising a polymer or similar material for preventing solder wetting on the sidewalls of the post. The conformal layer may cover all surfaces exposed by the photoresist strip and seed layer etch, such as the mushroom head, post, contact, and passivation layer.

In step 1017, an anisotropic etch may then be utilized to remove horizontal surfaces of the conformal layer, resulting in the passivated sidewall mushroom head shaped pillar structures. The anisotropic etch may comprise a wet chemical etch or a dry etch, such as a plasma etch, for example, that etches in the vertical direction but not in the lateral direction, or at least at a much lower rate.

In step 1019, the passivated sidewall mushroom-shaped pillar may be bonded to another contact, such as a substrate trace, where the conformal layer on the sidewalls of the post prevent solder wetting during reflow.

FIG. 11 is a flow chart illustrating example steps for a nail-head passivated sidewall pillar connection, in accordance with an example embodiment of the disclosure. The process described in FIG. 11 may correspond to the process described with respect to FIGS. 9A-9H, for example. In the first step 1101, a seed layer may be deposited on a contact and a passivation layer that partially covers the contact. In step 1103, a photoresist pattern may be formed on the seed layer with openings formed over a portion of the contact.

In step 1105, a metal plating process, such as copper plating, may fill the openings in the photoresist pattern to form a post, such that the height of the post may be closely associated with the photoresist thickness. In step 1107, another photoresist pattern may be formed on the first photoresist layer with openings over the posts and extending over the first photoresist layer.

In step 1109, a second plating step may form a "nail head" on the post, where the nail head may comprise two layers as described previously, and in step 1111, a solder plating may form a solder bump on the formed post and nail head.

In step 1113, the photoresist layer may be removed and the exposed seed layer may be etched. In an example scenario, the seed layer may be overetched, resulting in a post with a smaller diameter, increasing the aspect ratio between the nail head and post diameters.

In step 1115, the solder may be subjected to a reflow process, resulting in a more rounded structure on top of the post, followed by a conformal layer deposition in step 1117, with the conformal layer comprising a polymer or similar material for preventing solder wetting on the sidewalls of the post. The conformal layer may cover all surfaces exposed by the photoresist strip and seed layer etch, such as the nail head, post, contact, and passivation layer.

In step 1119, an anisotropic etch may then be utilized to remove horizontal surfaces of the conformal layer, resulting in the passivated sidewall nail head shaped pillar structures. The anisotropic etch may comprise a wet chemical etch or a dry etch, such as a plasma etch, for example, that etches in the vertical direction but not in the lateral direction, or at least at a much lower rate.

In step 1121, the passivated sidewall nail head pillar may be bonded to another contact, such as a substrate trace, where the conformal layer on the sidewalls of the post prevent solder wetting during reflow.

In an embodiment of the disclosure, a method and system are disclosed for copper pillar protection. In this regard, aspects of the disclosure may comprise forming a metal post over a contact on a semiconductor die, where the metal post comprises a sidewall, forming a metal cap on the metal post, where the metal cap is wider than the width of the metal post, forming a solder bump on the metal cap, and forming a conformal passivation layer on at least the sidewall of the metal post. The metal cap may comprise a rounded rectangular cross-section. The solder bump may be subject to a reflow process. The metal post and the metal cap may comprise copper. The metal cap may comprise a copper layer and a nickel layer. The seed metal layer may comprise one or more of titanium, tungsten, and copper. The conformal passivation layer may comprise a nonwettable polymer. Horizontal portions of the conformal passivation layer may be removed utilizing an anisotropic etch. The anisotropic etch may comprise a plasma etch.

In an embodiment of the disclosure, a method and system are disclosed for copper pillar protection. In this regard, aspects of the disclosure may comprise forming a seed metal layer on a metal contact and a passivation layer covering a portion of the contact, forming a photoresist layer on the seed metal layer, forming an opening in the photoresist layer over a portion of the metal contact, and forming a metal post in the opening. The height of the metal post may be closely associated with the thickness of the photoresist layer. A metal cap may be formed on the metal post, where the metal cap may be wider than the width of the post.

A solder bump may be formed on the metal cap. The photoresist and an exposed portion of the seed metal layer may be removed, wherein the exposed portion may comprise the seed metal layer that is not covered by the metal post. A conformal passivation layer may be formed on the passivation layer, the metal post, the solder bump, a portion of the metal cap not covered by the solder bump, and a portion of the metal contact not covered by a remaining portion of the metal seed layer or by the passivation layer. Horizontal portions of the conformal passivation layer may be removed so that only a sidewall of the metal post is covered by the conformal passivation layer.

The metal cap may be rounded shaped or rectangular shaped in cross-section. The solder bump may receive a reflow process. The metal post and the metal cap may comprise copper. The metal cap may comprise a copper layer and a nickel layer. The seed metal layer may comprise one or more of titanium, tungsten, and copper. The conformal passivation layer may comprise a nonwettable polymer. The horizontal portions of the conformal passivation layer may be removed utilizing an anisotropic etch, which may comprise a plasma etch.

A pillar connection with a passivation ring may be formed by forming a photoresist layer on a substrate, forming an opening in the photoresist layer over a portion of a metal contact on the substrate, forming a metal post in the opening on the metal contact. The height of the metal post may be less than the thickness of the photoresist layer. A conformal passivation layer may be formed on the photoresist layer and the metal post. Portions of the conformal passivation layer may be removed so that only a ring of the passivation layer remains at an interface between the photoresist and the metal post. A solder bump may be formed on the metal post and the photoresist may be removed.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for semiconductor packaging, the method comprising:
    forming a seed metal layer over a contact on a semiconductor die;
    forming a metal post on the seed metal layer over the contact on the semiconductor die, the metal post comprising a sidewall;
    forming a metal cap on the metal post;
    forming a solder bump on the metal cap;
    removing the seed metal layer from a portion of the contact extending beyond the metal post; and
    after said removing, forming a conformal dielectric layer of a polymer material on at least the sidewall of the metal post, a lower surface of the metal cap, and the contact.

2. The method according to claim 1, wherein the metal cap comprises two metal layers.

3. The method according to claim 2, wherein the metal cap comprises a copper layer and a nickel layer.

4. The method according to claim 1, wherein the metal cap comprises a rounded shaped cross-section.

5. The method according to claim 1, wherein the metal cap comprises a rectangular shaped cross-section.

6. The method according to claim 1, wherein the metal cap is wider than the width of the metal post.

7. The method according to claim 1, wherein the metal post and the metal cap comprise copper.

8. The method according to claim 1, wherein said seed metal layer comprises one or more of titanium, tungsten, and copper.

9. The method according to claim 1, wherein the conformal dielectric layer comprises a nonwettable polymer.

10. The method according to claim 1, comprising forming the conformal dielectric layer utilizing organic solderability preservatives.

11. The method according to claim 1, comprising removing horizontal portions of the conformal dielectric layer utilizing an anisotropic etch.

12. The method according to claim 11, wherein the anisotropic etch comprises a plasma etch.

13. A method for semiconductor packaging, the method comprising:
    forming a pillar connection with a dielectric ring by, at least:
        forming a photoresist layer on a substrate;
        forming an opening in the photoresist layer over a portion of a metal contact on the substrate;
        forming a metal post in the opening on the metal contact;
        forming a conformal dielectric layer on the photoresist layer and the metal post;
        removing portions of the conformal dielectric layer so that only a ring of the dielectric layer remains at an interface between the photoresist and the metal post;
        forming a solder bump on the metal post such that the solder bump fills an interior of the ring and contacts an upper surface of the metal post, a lower surface of the ring rests upon an upper surface of the metal post, and a lower surface of the solder bump rests upon an upper surface of the ring; and
    removing the photoresist.

14. An electronic device comprising:
    a passivated sidewall pillar connection comprising:
        a metal post formed over a contact on a semiconductor die, the metal post comprising a sidewall;
        a solder bump on the metal post; and
        a conformal dielectric layer in a ring shape;
        wherein the solder bump fills an interior of the ringed-shaped, conformal dielectric layer and contacts an upper surface of the metal post;
        wherein a lower surface of the ringed-shaped, conformal dielectric layer rests upon an upper surface of the metal post; and
        wherein a lower surface of the solder bump rests upon an upper surface of the ringed-shaped, conformal dielectric layer.

15. The electronic device according to claim 14, wherein a metal cap is formed on the metal post before the solder bump is formed.

* * * * *